(12) United States Patent
Moore (10) Patent No.: US 6,967,383 B2
(45) Date of Patent: *Nov. 22, 2005

(54) TRANSISTOR WITH NITROGEN-HARDENED GATE OXIDE

(75) Inventor: John T. Moore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/791,400

(22) Filed: Mar. 2, 2004

(65) Prior Publication Data

US 2004/0173861 A1 Sep. 9, 2004

Related U.S. Application Data

(60) Continuation of application No. 10/010,025, filed on Dec. 6, 2001, now Pat. No. 6,747,327, which is a division of application No. 09/585,688, filed on Jun. 1, 2000, now Pat. No. 6,342,437.

(51) Int. Cl.$^7$ .............................................. H01L 29/76
(52) U.S. Cl. ...................... 257/410; 257/411; 438/474; 438/761; 438/763
(58) Field of Search ................................ 257/410, 411; 438/474, 761, 763

(56) References Cited

U.S. PATENT DOCUMENTS

| | | | |
|---|---|---|---|
| 5,567,638 A | 10/1996 | Lin et al. ................. | 438/592 |
| 5,633,177 A | 5/1997 | Anjum ..................... | 438/301 |
| 6,013,553 A | 1/2000 | Wallace et al. ............ | 438/287 |
| 6,017,808 A | 1/2000 | Wang et al. ............... | 438/528 |
| 6,136,654 A | 10/2000 | Kraft et al. ............... | 438/287 |
| 6,140,024 A | 10/2000 | Misium et al. ............ | 430/314 |
| 6,251,761 B1 | 6/2001 | Rodder et al. ............. | 438/591 |
| 6,261,973 B1 | 7/2001 | Misium et al. ............ | 438/775 |
| 6,342,437 B1 | 1/2002 | Moore ....................... | 438/474 |
| 6,528,396 B2 | 3/2003 | Moore ....................... | 438/484 |
| 6,747,327 B2 * | 6/2004 | Moore ....................... | 257/410 |

OTHER PUBLICATIONS

Al-Shareef et al., "Device Performance of in situ Steam Generated Gate Dielectric Nitrided by Remote Plasma Nitridation", Applied Physics Letters, vol. 78, No. 24, Jun. 11, 2001, pps. 3875–3877.

Al-Shareef et al., "Plasma Nitridation of Very Thin Gate Dielectrics", Microelectronic Engineering, 59, 2001, pps 317–322.

(Continued)

*Primary Examiner*—Christian Wilson
(74) *Attorney, Agent, or Firm*—TraskBritt, PC (57) ABSTRACT

The present invention provides an improved surface P-channel transistor and a method of making the same. A preferred embodiment of the method of the present invention includes providing a semiconductor substrate, forming a gate oxide layer over the semiconductor substrate, subjecting the gate oxide layer to a remote plasma nitrogen hardening treatment followed by an oxidative anneal, and forming a polysilicon layer over the resulting gate oxide layer. Significantly, the method of the present invention does not require nitrogen implantation through the polysilicon layer overlying the gate oxide and provides a surface P-channel transistor having a polysilicon electrode free of nitrogen and a hardened gate oxide layer characterized by a large concentration of nitrogen at the polysilicon electrode/gate oxide interface and a small concentration of nitrogen at the gate oxide/semiconductor substrate interface. The method of the present invention is easily incorporated into known fabrication processes and provides an enhanced surface P-channel transistor that resists hot electron degradation, is substantially impermeable to dopants included in overlying layers, and is characterized by a greatly increased extrapolated time dependent dielectric breakdown value.

14 Claims, 4 Drawing Sheets

OTHER PUBLICATIONS

Hattangady et al., "Ultrathin Nitrogen–Profile Engineered Gate Dielectric Films", IEDM Tech. Dig., 1996, pps. 495–498.

Koh et al., "Plasma–Engineered Si–$SiO_2$ Interfaces: Monolayer Nitrogen Atom Incorporation by Low–Temperature Remote Plasma–Assisted Oxidation in $N_2O$", Surface and Coatings Technology, 1998; pps. 1524–1528.

Lucovsky et al., "Plasma Processed Ultra–Thin $SiO_2$ Interfaces for Advanced Silicon NMOS and PMOS Devices: Applications to Si–Oxide/Si Oxynitride, Si–Oxide/Si Nitride and Si–Oxide/ Transition Metal Oxide Stacked Gate Dielectrics", Thin Solid Films, 2000, pps. 217–227.

Mehrotra et al., "A 1.2V, Sub–0.09 $\mu$m Gate Length CMOS Technology", IEDM Tech. Dig., 1999, pps. 419–422.

Niimi et al., "Monolayer–Level Controlled Incorporation of Nitrogen in Ultrathin Gate Dielectrics Using Remote Plasma Processing: Formation of Stacked "N–O–N" Gate Dielectrics", J. Vac. Sci. Technology B 17, Nov./Dec. 1999, pps. 2610–2621.

Ting et al., "The Effect of the Remote Plasma Nitridation on the Integrity of the Ultrathin Gate Dielectric Films in 0.13 $\mu$m CMOS Technology and Beyond", IEEE Electron Device Letters, vol. 22, No. 7, Jul. 2001, pps. 327–329.

* cited by examiner

TRANSISTOR WITH NITROGEN-HARDENED GATE OXIDE

CROSS-REFERENCE TO RELATED APPLICATIONS

This application is a continuation of application Ser. No. 10/010,025, filed Dec. 6, 2001, now U.S. Pat. No. 6,747,327, issued Jun. 8, 2004, which is a divisional of application Ser. No. 09/585,688, filed Jun. 1, 2000, now U.S. Pat. No. 6,342,437, issued Jan. 29, 2002.

BACKGROUND OF THE INVENTION

1. Field of the Invention

The present invention relates to semiconductor devices and methods for their fabrication. Specifically, the present invention relates to surface P-channel transistors, including hardened gate oxides, possessing enhanced performance and reliability characteristics.

2. State of the Art

Higher performance, enhanced reliability, and greater packaging density of integrated circuits are constant goals of the semiconductor industry. However, as components become smaller and smaller to meet these goals, it becomes increasingly difficult to produce semiconductor devices capable of reliable, long-term operation, particularly in light of the operational stresses each component of a state of the art semiconductor device must endure. For example, as state of the art surface P-channel transistors decrease in size, the size and thickness of the gate oxides included in these transistors must also decrease, but as gate oxides shrink, they become more permeable to dopants included in overlying polysilicon electrodes, less resistant to hot electron degradation, and more susceptible to breakdown at voltages below normal operating parameters.

To combat such problems, various processes for hardening gate oxides have become essential to the fabrication of state of the art semiconductor devices, and several hardening processes are well-known in the art. For example, both furnace-based nitrogen processing and remote plasma-based nitrogen hardening ("RPN") may be used to harden gate oxides. Relative to nonhardened devices, gate oxides hardened by known methods are generally less permeable to dopants included in polysilicon electrodes, more resistant to hot electron degradation, and less susceptible to breakdown at voltages below normal operating voltages. However, known processes for hardening gate oxides also have drawbacks. For example, after being subjected to such processes, gate oxides often contain a significant amount of unbound, or interstitial, nitrogen, which is mobile and may diffuse out of the gate oxide, reducing the effectiveness of the hardening procedure and contaminating the overlying polysilicon electrode. Further, in order to prevent diffusion of dopants from the polysilicon electrode and into and through the gate oxide, known hardening processes often provide a high concentration of nitrogen at the interface of the gate oxide and the underlying semiconductor substrate. However, as is known, excessive nitrogen at the gate oxide/substrate interface significantly degrades transistor performance.

In terms of device performance and reliability, it has been found to be advantageous to fabricate a gate oxide having a large nitrogen concentration (about 2.5% or greater nitrogen by atomic weight) at the interface of the gate oxide and the overlying polysilicon electrode while having a small nitrogen concentration (about 0.5% nitrogen by atomic weight) at the gate oxide/substrate interface. The large nitrogen concentration at the polysilicon electrode/gate oxide interface effectively prevents diffusion of dopants from the polysilicon electrode and into and through the gate oxide, while the small nitrogen concentration at the gate oxide/substrate interface confers resistance to hot electron degradation without substantially effecting device performance. Yet known processing techniques do not reliably provide surface P-channel transistors including a gate oxide having a large nitrogen concentration at the polysilicon electrode/gate oxide interface and a small nitrogen concentration at the gate oxide/substrate interface.

At least one method has been developed in an attempt to provide a transistor including a gate oxide having similar characteristics. U.S. Pat. No. 6,017,808 to Wang et al. (hereinafter "the '808 Patent") describes a method for hardening a gate oxide designed to provide a transistor wherein a large peak of nitrogen exists within the polysilicon and oxide layers at the interface of the gate oxide and the overlying polysilicon electrode, while a relatively smaller nitrogen peak occurs within the oxide layer and the underlying semiconductor substrate at the interface of the gate oxide and the underlying semiconductor substrate. To achieve this structure, the method of the '808 Patent requires implanting nitrogen through the polysilicon layer and into the gate oxide layer followed by an anneal step. After the implantation and annealing steps, a first nitrogen peak occurs entirely within the polysilicon layer, a second nitrogen peak occurs within the polysilicon layer and the gate oxide at the polysilicon/gate oxide interface, and a third nitrogen peak occurs within the gate oxide layer and underlying substrate at the gate oxide/substrate interface. However, the first nitrogen peak located entirely within the polysilicon layer is problematic because it retards diffusion of subsequently implanted dopants, such as boron, within the polysilicon layer. Therefore, the method of the '808 Patent requires removal of only the portion of the polysilicon layer including the first nitrogen peak without removing the portion of the polysilicon layer including the second nitrogen peak. Once the portion of the polysilicon layer including the first nitrogen peak is removed, an additional, nitrogen-free polysilicon layer may be optionally formed over the remaining portion of the nitrogen implanted polysilicon layer.

As will be readily appreciated, achieving the structure disclosed in the '808 Patent using the methods described therein is at best problematic, particularly in light of the continually decreasing thicknesses of polysilicon electrodes included in state of the art semiconductor devices. One of the most problematic aspects of the method described in the '808 Patent is the need to remove only the portion of the nitrogen implanted polysilicon layer including the first nitrogen peak. The reference teaches that this task may be accomplished using known wet etch, dry etch, or chemical mechanical polishing processes. However, the polysilicon layers used for polysilicon electrodes in state of the art transistors are exceedingly thin. The polysilicon electrodes of some state of the art devices may be as thin as seven or fewer molecular monolayers, and known etching and polishing processes are difficult to control with sufficient precision to remove only predetermined portions of material layers of such minute thicknesses. Moreover, in this context, the polysilicon layer will include varying concentrations of nitrogen at any given depth, and as the nitrogen concentration varies, the etch rate will also vary, making precise control of the etching process even more difficult. Thus, removing only the portion of the polysilicon layer including the first nitrogen peak is extremely difficult, and known removal processes will most likely result in removal of too much or too little polysilicon material, resulting in transistors exhibiting impaired performance or reduced reliability.

It would, therefore, be desirable to provide a method for fabricating a surface P-channel transistor which provides a surface P-channel transistor including a hardened gate oxide characterized by a large nitrogen concentration at the polysilicon/gate oxide interface and a small nitrogen concentration at the gate oxide/substrate interface, and which can be accomplished without the need to partially remove the polysilicon layer overlying the gate oxide. Ideally, such a method could be easily incorporated into current fabrication processes and would reliably produce state of the art surface P-channel transistors exhibiting enhanced performance and reliability.

BRIEF SUMMARY OF THE INVENTION

The method and device of the present invention answer the foregoing needs. In a preferred embodiment, the present invention includes a method for forming improved surface P-channel transistors including providing a semiconductor substrate and forming a gate oxide layer over the semiconductor substrate. According to the method of the present invention, the gate oxide layer is subjected to a RPN treatment, which incorporates a high concentration of nitrogen into an upper area of the gate oxide layer. Following the RPN treatment, the resultant intermediate structure is annealed in an environment including an oxygen-containing or nitrogen-containing oxidant. The anneal step smooths out the distribution of nitrogen within the gate oxide layer, reacts substantially all of the unbound or interstitial nitrogen left after the RPN treatment, and results in a gate oxide layer having a large concentration of nitrogen near its upper surface and a small concentration of nitrogen at the interface of the gate oxide layer and the underlying semiconductor substrate. Following the oxidative anneal, a polysilicon layer is formed over the gate oxide layer, and the resultant intermediate structure may be processed by known fabrication techniques to define one or more surface P-channel transistors as well as any other feature necessary to the proper function of a desired semiconductor device.

In an alternative embodiment, the gate oxide layer formed over the semiconductor substrate may be formed in a nitrogen-containing environment to provide a gate oxide layer including a small concentration of nitrogen throughout its depth. The lightly nitridated gate oxide layer is then subjected to a RPN treatment, resulting in a gate oxide layer having a large concentration of nitrogen near its upper surface and a smaller concentration of nitrogen at the interface of the gate oxide layer and the underlying semiconductor substrate. Once the RPN treatment is complete, the resultant intermediate structure may be processed by known fabrication techniques to define one or more surface P-channel transistors as well as any other feature necessary to the proper function of a semiconductor device.

As can be easily appreciated, the method of the present invention enables fabrication of surface P-channel transistors including hardened gate oxides characterized by a large concentration of nitrogen at its upper surface and a small concentration of nitrogen at the interface of the gate oxide layer and the underlying semiconductor substrate. Moreover, the method of the present invention does not involve nitrogen implantation of the oxide layer through an overlying polysilicon layer, and, as a result, does not require partial removal of a specific portion of the polysilicon layer for fabrication of a functioning and reliable polysilicon electrode. Finally, the method of the present invention is easily incorporated into processes for fabricating state of the art semiconductor devices, and because it does not require partial removal of the polysilicon electrode layer, the method of the present invention may be applied even as feature dimensions of state of the art semiconductor devices continue to decrease.

The surface P-channel transistors of the present invention are produced by the method of the present invention and include a semiconductor substrate, a substantially nitrogen-free polysilicon electrode, and a hardened gate oxide characterized by a large concentration of nitrogen at its upper surface and a small concentration of nitrogen at the gate oxide/substrate interface. Due to the physical characteristics of its hardened gate oxide, the surface P-channel transistor of the present invention exhibits performance and reliability advantages over known devices. For example, the surface P-channel transistor of the present invention does not exhibit the disadvantageous roll-off characteristics of surface channel transistors including gate oxides having a large concentration of nitrogen at the gate oxide/substrate interface, yet the surface P-channel transistor of the present invention possesses a greatly enhanced extrapolated time dependent dielectric breakdown ("TDDB"). Additionally, the gate oxide of a surface P-channel transistor according to the present invention preferably includes substantially no unbound or interstitial nitrogen. Therefore, the improved surface P-channel transistor of the present invention avoids many of the difficulties associated with known surface channel transistors including nitrogen-hardened gate oxides.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

The drawings presented in conjunction with the description of the present invention are not actual views of any particular portion of an actual semiconducting device or component, but are merely representations employed to more clearly and fully depict the present invention.

DETAILED DESCRIPTION OF THE INVENTION

The method of the present invention is relatively simple, maybe easily incorporated into existing fabrication processes, and reliably produces a surface P-channel transistor including a gate oxide that enhances device performance and longevity.

Figure 1:
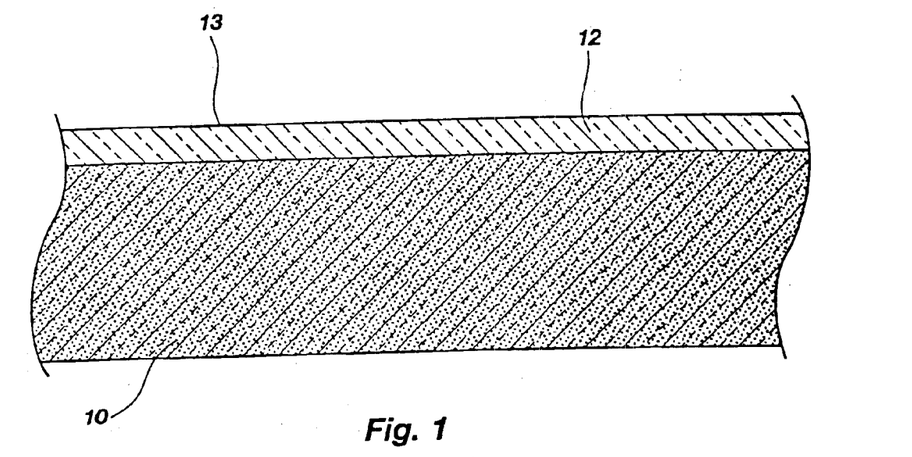
FIG. 1 illustrates a semiconductor substrate covered by a gate oxide layer having an upper surface.

In a preferred embodiment, the method of the present invention includes providing a semiconductor substrate 10 having a gate oxide layer 12 formed thereover, as is illustrated in drawing FIG. 1. The semiconductor substrate 10 may be made of any suitable material known in the art, and the gate oxide layer 12 can be formed over the semiconductor substrate 10 using any known process using any suitable material known in the art. For example, the semiconductor substrate 10 may be fabricated using silicon and the gate oxide layer 12 may include silicon dioxide ($SiO_2$) which has been thermally grown or vapor deposited using well-known methods. The gate oxide layer 12 includes an upper surface 13 and may be formed in various thicknesses to suit various fabrication processes. The gate oxide layer 12, however, will generally have a thickness of about 70 Å or less, and for use in state of the art 0.18 $\mu$m technology, a gate oxide layer 12 having a thickness in the range of about 30Å to 50Å is preferred.

Figure 2:
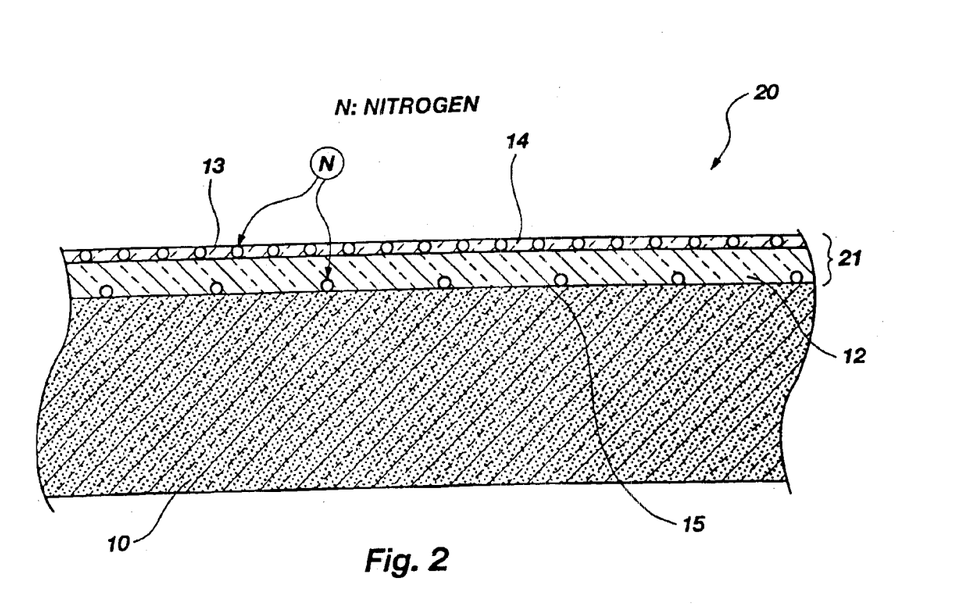
FIG. 2 illustrates the structure of FIG. 1 after such structure has been subjected to a RPN treatment.

After provision of the semiconductor substrate 10 having the gate oxide layer 12 formed thereover, the gate oxide layer 12 is subjected to a RPN treatment. The RPN treatment incorporates nitrogen into an upper area 14 (depicted in FIG. 2) of the gate oxide layer 12, resulting in a large concentration of nitrogen at the upper surface 13 of the gate oxide layer 12. Shown in drawing FIG. 3, a graph of a binding energy analysis of the gate oxide layer 12 after the RPN treatment. The nitrogen-containing upper area 14 of the gate oxide layer 12 includes unbound or interstitial nitrogen (indicated by the oxy-nitride peak 16) as well as silicon nitride ($Si_3N_4$) (indicated by the nitride peak 18).

RPN treatments are well documented in the art, and, as will be appreciated by the skilled artisan, any suitable RPN treatment may be used in the context of this invention. For example, a thermal RPN treatment using microwave plasma to excite the nitrogen molecules included in the process environment may be conducted at substantially 750° C. for approximately two minutes. However, a high density plasma (HDP) RPN treatment is presently preferred.

Where a HDP RPN is used, the process may be conducted at between about substantially 60° C. and 65° C. for about 10 seconds using 1500 watts power. Where a gate oxide layer having a thickness of substantially 30Å is subjected to such an HDP RPN treatment, the highest concentration of nitrogen (approximately 20.5% by atomic weight) will occur at the upper surface 13 of the gate oxide layer 12, but the nitrogen will only extend approximately substantially 9Å within the substantially 30Å gate oxide layer. Therefore, the RPN treatment incorporates nitrogen in only the upper area 14 of the gate oxide layer 12.

As has been discussed, however, it is highly desirable to include a small concentration of nitrogen at the interface of the gate oxide layer 12 and the semiconductor substrate 10. In order to more progressively distribute, or "smooth out," the nitrogen concentration within the gate oxide layer 12, the intermediate structure 20 (shown in drawing FIG. 2) formed by the RPN treatment is annealed in an environment containing either an oxygen-containing oxidant or a nitrogen-containing oxidant. For example, the anneal may be conducted in an $N_2$ environment at substantially 800° C. for 60 seconds. However, various anneal processes are known in the art, and different anneal processes executed in different reactive environments, such as $N_2O$ or NO environments, may also be used in the context of the present invention to achieve the desired results.

Even after the anneal, the upper area 14 of the gate oxide layer 12 includes a high concentration of nitrogen. However, during the anneal, the nitrogen is progressively incorporated throughout the depth 21 of the gate oxide layer 12, resulting in a small concentration of nitrogen at the interface 15 of the gate oxide layer 12 and the semiconductor substrate 10. Most preferably, the small concentration of nitrogen at the gate oxide layer/semiconductor substrate interface 15 will equal an atomic concentration of about 0.5%. If significantly more nitrogen is included at the gate oxide layer/semiconductor substrate interface 15, the resulting transistor will exhibit increasing threshold voltage ($V_T$) roll-off, and if significantly less nitrogen is included at the gate oxide layer/semiconductor substrate interface 15, the gate oxide will be more susceptible to hot electron degradation and the resulting transistor will exhibit a lower TDDB. Additionally, though the large nitrogen concentration of the upper area 14 of the gate oxide layer 12 may vary significantly, it is preferred that the concentration of nitrogen at the upper surface 13 of the gate oxide layer 12 be at least about five times greater than the small nitrogen concentration included at the gate oxide layer/semiconductor substrate interface 15, as it has been determined that such a concentration is necessary to effectively block dopant diffusion from the polysilicon electrode and into and through the upper area 14 of the gate oxide layer 12.

Figure 3:
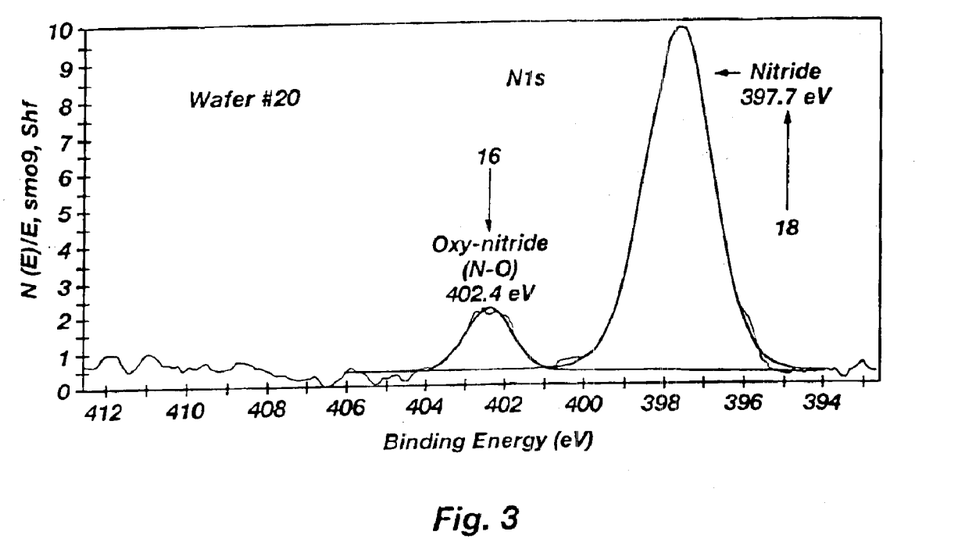
FIG. 3 provides a graph illustrating the results of a binding energy analysis performed on a gate oxide layer after the gate oxide layer was subjected to a RPN treatment.
Figure 4:
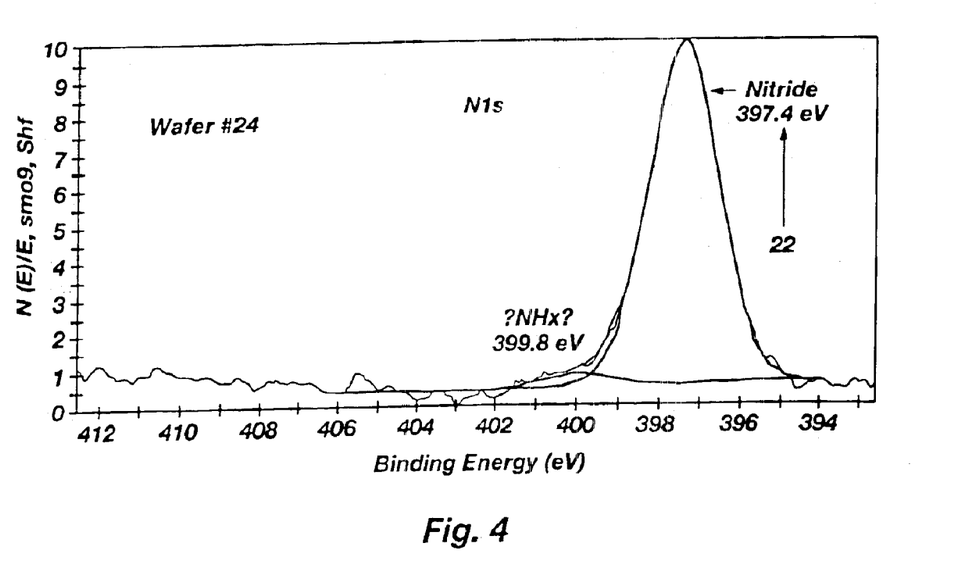
FIG. 4 provides a graph illustrating the results of a binding energy analysis performed on a gate oxide layer after the gate oxide layer was subjected to a RPN treatment and annealed in an $N_2$ environment.
Figure 5:
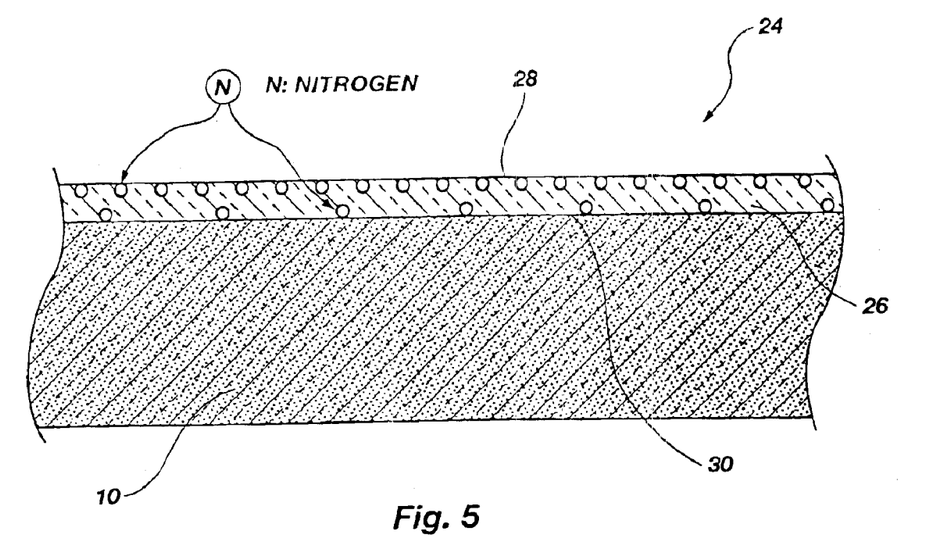
FIG. 5 illustrates an intermediate semiconductor structure including a semiconductor substrate and a hardened gate oxide layer.

As can be appreciated by reference to drawing FIG. 3 and drawing FIG. 4, annealing the intermediate structure 20 resulting from the RPN treatment has an additional advantage. As already discussed, drawing FIG. 3 provides a graph of a binding energy analysis of the gate oxide layer 12 immediately following the RPN treatment. Again, as is demonstrated by the oxy-nitride peak 16 and the nitride peak 18 shown in drawing FIG. 3, following the RPN treatment, the nitrogen-containing upper area 14 of the gate oxide layer 12 includes unbound or interstitial nitrogen as well as $Si_3N_4$. As is evidenced by the information provided in drawing FIG. 4, however, after annealing the intermediate structure 20, the gate oxide layer 12 no longer includes a significant amount of interstitial nitrogen (indicated by the lack of a significant oxy-nitride peak) but includes an increased amount of $Si_3N_4$, as is indicated by a second nitride peak 22. Thus, annealing the first intermediate structure 20 results in a second intermediate structure 24 (depicted in drawing FIG. 5) including a semiconductor substrate 10 and a hardened gate oxide layer 26 characterized by a large concentration of nitrogen at the upper surface 28, a small concentration of nitrogen at the hardened gate oxide layer/semiconductor substrate interface 30, and substantially no unbound or interstitial nitrogen.

Figure 6:
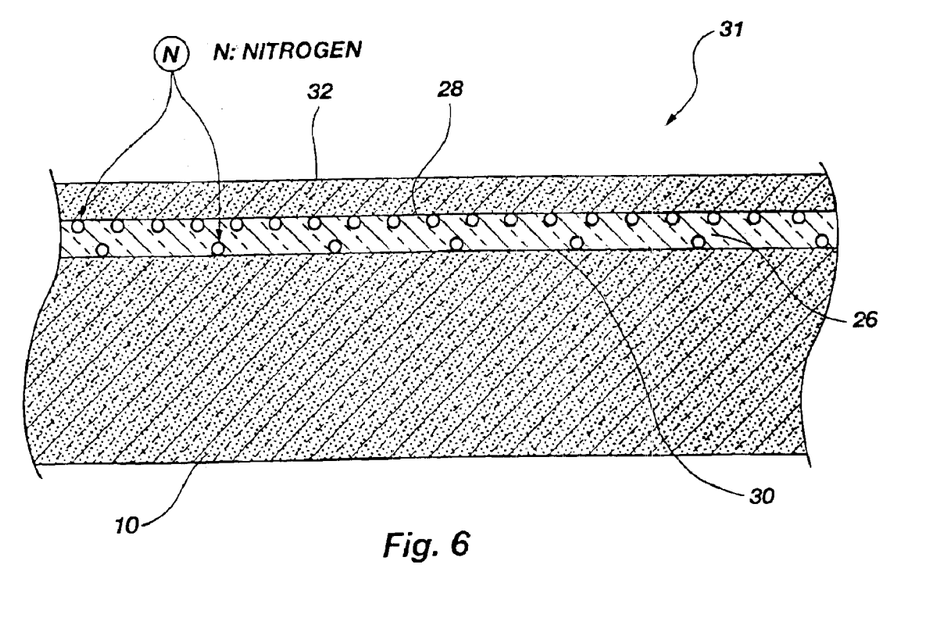
FIG. 6 illustrates another intermediate semiconductor structure created by forming a polysilicon layer over the hardened gate oxide layer of the intermediate structure illustrated in FIG. 5.

Following the anneal step, a third intermediate structure 31 (illustrated in drawing FIG. 6) is formed by forming a polysilicon layer 32 over the hardened gate oxide layer 26. The polysilicon layer 32 is formed using any known process and may also be doped with boron or other known dopants such that the polysilicon layer 32 can be used to form polysilicon electrodes with desired electrical properties. The third intermediate structure 31 is then processed as is known in the art to produce a semiconductor device including at least one surface P-channel transistor which incorporates a portion of the hardened gate oxide layer 26 for a gate oxide as well as a portion of the overlying polysilicon layer 32 for a polysilicon electrode.

The preferred embodiment of the method of the present invention, therefore, provides an enhanced surface P-channel transistor. The gate oxide produced by the method of the present invention prevents diffusion of dopant from the overlying polysilicon electrode, resists hot electron degradation without adverse $V_T$ roll-off effects, exhibits enhanced resistance to breakdown below normal operating voltages, and results in a surface P-channel transistor having a greatly increased TDDB. In fact, while transistors incorporating gate oxides hardened by RPN alone have an extrapolated TDDB of approximately 8 years, the method of the preferred embodiment of the method of the present invention provides a surface P-channel transistor having an extrapolated TDDB of 500 years.

In an alternative embodiment of the method of the present invention, the hardened gate oxide layer is formed using a different process. Instead of subjecting the gate oxide layer to a RPN treatment followed by an anneal, the gate oxide layer is formed in a nitrogen-containing environment to provide a slightly nitridated gate oxide layer, which is subsequently subjected to a RPN treatment to achieve a high concentration of nitrogen in an upper area of the gate oxide layer. The lightly nitridated gate oxide layer may be formed by executing a known oxide deposition or growth process in a nitrogen-containing environment, but for reasons already discussed, the lightly nitridated gate oxide layer should not include more than about 0.5% nitrogen by atomic weight. Moreover, as with the preferred embodiment of the method of the present invention, any suitable RPN treatment known in the art may be used. The hardened gate oxide layer formed in the alternative embodiment of the method of the present invention, therefore, will include a small concentration of nitrogen (no more than about 0.5%) at the interface of the hardened gate oxide and the underlying semiconductor substrate, as well as a high concentration of nitrogen at its upper surface due to the RPN treatment.

The alternative embodiment of the method of the present invention also includes forming a polysilicon layer over the hardened gate oxide layer. As was the case in the preferred embodiment of the method of the present invention, following formation of the polysilicon layer, the resultant intermediate structure may be processed as is known in the art to produce a semiconductor device including at least one surface P-channel transistor which incorporates a portion of the hardened gate oxide layer for a gate oxide as well as a portion of the overlying polysilicon layer for a polysilicon electrode. However, the alternative embodiment of the method of the present invention is not preferred because the gate oxide layer formed in the alternative embodiment includes a significant amount of interstitial nitrogen due to the lack of a post RPN anneal.

Nevertheless, as will be apparent to the skilled artisan, the method of the present invention does not involve nitrogen implantation into the gate oxide layer through an overlying polysilicon layer. The method of the present invention, therefore, does not necessitate the partial removal of the overlying polysilicon layer to facilitate fabrication of a high-performance, reliable polysilicon electrode. As a result, the method of the present invention provides a more reliable and easily executed technique for forming an enhanced surface P-channel transistor, particularly when the ever-shrinking dimensions of state of the art semiconductor device features are considered.

The present invention also includes the enhanced surface P-channel transistor 37 produced by the method of the present invention. As is illustrated in drawing FIG. 7, a surface P-channel transistor 37 of the present invention includes a semiconductor substrate 38, a gate oxide 40, and a polysilicon electrode 42 overlying the gate oxide 40. The gate oxide 40 includes a large concentration of nitrogen (i.e., approximately 2.5% or more nitrogen by atomic weight) near the interface 44 of the polysilicon electrode 42 and the gate oxide 40, and the gate oxide 40 includes a small concentration of nitrogen (i.e., approximately 0.5% nitrogen by atomic weight) at the interface 46 of gate oxide 40 and the underlying semiconductor substrate 38. It should be understood however, that the surface P-channel transistor 37 of the present invention is not limited to the features detailed herein and may include other well-known features. Moreover, the surface P-channel transistor 37 can be fabricated in various sizes to suit virtually any application.

Figure 7:
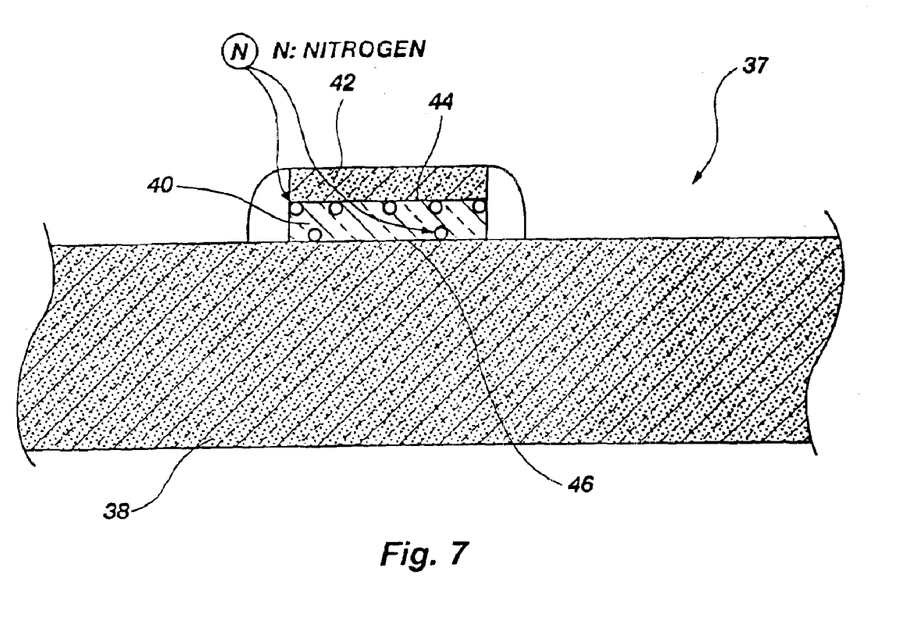
FIG. 7 illustrates one embodiment of the surface P-channel transistor of the present invention.

Due to the physical characteristics of the gate oxide 40 incorporated therein, the surface P-channel transistor 37 of the present invention shows enhanced performance and reliability. The gate oxide 40 of the surface P-channel transistor 37 of the present invention provides a transistor that possesses enhanced resistance to hot electron degradation, less susceptibility to breakdown below normal operating voltages, substantially no $V_T$ roll-off, and an extrapolated TDDB of 500 years. Moreover, in contrast to the surface channel transistor formed by the method of the '808 Patent, the polysilicon electrode 42 overlying the gate oxide 40 of the surface P-channel transistor 37 of the present invention is nitrogen-free, allowing for more effective distribution of the dopants. Therefore, the surface P-channel transistor 37 of the present invention not only exhibits enhanced performance and reliability, but the surface P-channel transistor 37 of the present invention will not suffer from performance problems associated with dopant depletion regions in the polysilicon electrode 42 which may result from nitrogen implanted into and through the polysilicon layer.

Though the surface P-channel transistor and method of the present invention have been described herein with reference to specific examples, such examples are for illustrative purposes only. The scope of the present invention is defined by the appended claims and is, therefore, not limited by the preceding description and drawings.

What is claimed is:

1. A transistor, comprising:
   a substrate;
   a nitrogen-free polysilicon electrode contacting a portion of the substrate; and
   a gate oxide disposed between the substrate and the nitrogen-free polysilicon electrode, the gate oxide including about 0.5% nitrogen by atomic weight at an interface with the substrate, the nitrogen progressively increasing to comprise between 2.5% and 10.0% nitrogen by atomic weight at an interface with the nitrogen-free polysilicon electrode, the gate oxide hardened using a remote plasma-based nitrogen hardening treatment and annealed thereafter.

2. The transistor of claim 1, wherein the nitrogen-free polysilicon electrode has a bottom surface comprises a P-type dopant.

3. The transistor of claim 2, wherein the P-type dopant is boron.

4. A surface P-channel transistor, comprising:
   a substrate;
   a nitrogen-free polysilicon electrode contacting a portion of the substrate, the electrode comprising a P-type dopant including boron; and
   a gate oxide disposed between the substrate and the nitrogen-free polysilicon electrode, the gate oxide including about 0.5% nitrogen by atomic weight at an interface with the substrate, the nitrogen progressively increasing to comprise between 2.5% and 10.0% nitrogen by atomic weight at an interface with the nitrogen-free polysilicon electrode, the gate oxide hardened using a remote plasma-based nitrogen hardening treatment and annealed thereafter.

5. The surface P-channel transistor of claim 4, wherein the gate oxide comprises a hardened gate oxide using a remote plasma-based nitrogen hardening treatment using a high density plasma process for approximately 60° C. for about 10 seconds using about 1500 watts of power.

6. The surface P-channel transistor of claim 1, wherein the gate oxide comprises hardening the gate oxide using a thermal remote plasma-based nitrogen hardening treatment process at approximately 750° C. for about 2 minutes.

7. The surface P-channel transistor of claim 1, wherein the gate oxide comprises a hardened gate oxide annealed at approximately 800° C. for approximately 60 seconds.

8. A transistor, comprising:

a substrate;

a nitrogen-free polysilicon electrode contacting a portion of the substrate; and a gate oxide disposed between the substrate and the nitrogen-free polysilicon electrode, the gate oxide including essentially 0.5% nitrogen by atomic weight at an interface with the substrate, the nitrogen progressively increasing to comprise essentially in the range of between 2.5% and 10.0% nitrogen by atomic weight at an interface with the nitrogen-free polysilicon electrode, the gate oxide hardened using a remote plasma-based nitrogen hardening treatment and annealed thereafter.

9. The transistor of claim 8, wherein the nitrogen-free polysilicon electrode has a bottom surface comprising a P-type dopant.

10. The transistor of claim 8, wherein the P-type dopant includes boron.

11. A surface P-channel transistor, comprising:

a substrate;

a nitrogen-free polysilicon electrode contacting a portion of the substrate, the electrode comprising a P-type dopant including boron; and a gate oxide disposed between the substrate and the nitrogen-free polysilicon electrode, the gate oxide including essentially 0.5% nitrogen by atomic weight at an interface with the substrate, the nitrogen progressively increasing to comprise essentially in the range of between 2.5% and 10.0% nitrogen by atomic weight at an interface with the nitrogen-free polysilicon electrode, the gate oxide hardened using a remote plasma-based nitrogen hardening treatment and annealed thereafter.

12. The surface P-channel transistor of claim 4, wherein the gate oxide comprises a hardened gate oxide using the remote plasma-based nitrogen hardening treatment using a high density plasma process for essentially 60° C. for about 10 seconds using essentially 1500 watts of power.

13. The surface P-channel transistor of claim 4, wherein the gate oxide comprises hardening the gate oxide using a thermal remote plasma-based nitrogen hardening treatment process at essentially 750° C. for essentially 2 minutes.

14. The surface P-channel transistor of claim 4, wherein the gate oxide comprises a hardened gate oxide annealed at essentially 800° C. for essentially 60 seconds.

* * * * *

UNITED STATES PATENT AND TRADEMARK OFFICE
CERTIFICATE OF CORRECTION

| | | |
|---|---|---|
| PATENT NO. | : 6,967,383 B2 | Page 1 of 1 |
| APPLICATION NO. | : 10/791400 | |
| DATED | : November 22, 2005 | |
| INVENTOR(S) | : John T. Moore | |

It is certified that error appears in the above-identified patent and that said Letters Patent is hereby corrected as shown below:

In the specification:
    COLUMN 5,   LINE 28,   after "FIG. 3," insert --is--

In the claims:
CLAIM 6,   COLUMN 9,   LINE 10,   change "1," to --4,--

Signed and Sealed this

Twenty-seventh Day of November, 2007

JON W. DUDAS
*Director of the United States Patent and Trademark Office*